US012096588B2

(12) United States Patent
Chen et al.

(10) Patent No.: US 12,096,588 B2
(45) Date of Patent: Sep. 17, 2024

(54) SERVER CHASSIS

(71) Applicants: Inventec (Pudong) Technology Corporation, Shanghai (CN); INVENTEC CORPORATION, Taipei (TW)

(72) Inventors: Han-Sheng Chen, Taipei (TW); Jen-Yuan Chang, Taipei (TW); Po-Hsiu Chen, Taipei (TW); Hsieh-Liang Tsai, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 196 days.

(21) Appl. No.: 17/941,112

(22) Filed: Sep. 9, 2022

(65) Prior Publication Data

US 2023/0284410 A1 Sep. 7, 2023

(30) Foreign Application Priority Data

Mar. 1, 2022 (CN) .......................... 202210195418.7

(51) Int. Cl.
*H05K 7/20* (2006.01)
*H05K 7/14* (2006.01)

(52) U.S. Cl.
CPC ....... *H05K 7/1488* (2013.01); *H05K 7/20172* (2013.01); *H05K 7/20736* (2013.01)

(58) Field of Classification Search
CPC ............. H05K 7/1488; H05K 7/20172; H05K 7/20736

USPC ......................................................... 361/695
See application file for complete search history.

(56) References Cited

U.S. PATENT DOCUMENTS

| 6,123,312 | A * | 9/2000 | Dai .......................... F16F 9/53 267/136 |
| 6,633,489 | B2 * | 10/2003 | Callahan ............... H01L 23/562 361/767 |
| 6,912,127 | B2 * | 6/2005 | Hutchinson ......... F04D 25/0613 248/633 |
| 6,920,052 | B2 * | 7/2005 | Callahan ............... H01L 23/562 361/767 |
| 7,611,157 | B2 * | 11/2009 | Robbins .................... G06F 1/16 280/47.35 |
| 7,839,639 | B2 * | 11/2010 | Najbert ................. F04D 29/668 361/695 |
| 8,395,895 | B2 * | 3/2013 | Yoon .................. H04N 1/00549 361/695 |
| 2007/0114486 | A1 * | 5/2007 | Takeuchi ................. F16J 15/43 252/503 |
| 2008/0043430 | A1 * | 2/2008 | Chen ........................ G06F 1/20 361/679.54 |
| 2009/0020666 | A1 * | 1/2009 | Brenner ................. A61B 90/50 248/176.1 |

(Continued)

FOREIGN PATENT DOCUMENTS

CN 108317103 A * 7/2018

*Primary Examiner* — Anatoly Vortman
(74) *Attorney, Agent, or Firm* — Locke Lord LLP; Tim Tingkang Xia, Esq.

(57) ABSTRACT

A server chassis including a chassis body, at least one damper and a fan frame. The at least one damper is fixed to the chassis body. The fan frame is disposed on the chassis body via the at least one damper. The at least one damper is a magnetorheological fluid damper.

8 Claims, 2 Drawing Sheets

(56) References Cited

U.S. PATENT DOCUMENTS

| | | | |
|---|---|---|---|
| 2010/0165578 A1* | 7/2010 | Kearns | H01L 23/40 361/710 |
| 2011/0158791 A1* | 6/2011 | Li | G06F 1/20 415/119 |
| 2022/0392665 A1* | 12/2022 | Hsieh | H02G 15/113 |
| 2023/0284410 A1* | 9/2023 | Chen | H05K 7/20727 361/679.02 |

* cited by examiner

SERVER CHASSIS

CROSS-REFERENCE TO RELATED APPLICATIONS

This non-provisional application claims priority under 35 U.S.C. § 119(a) on Patent Application No(s). 202210195418.7 filed in China, on Mar. 1, 2022, the entire contents of which are hereby incorporated by reference.

BACKGROUND OF THE INVENTION

Technical Field of the Invention

The invention relates to a server chassis, more particularly to a server chassis including at least one damper.

Description of the Related Art

In general, in order to effectively dissipate the heat generated by an electronic component in the server, at least one fan is disposed in the server chassis. Also, for the convenience of removing the fan from the server chassis, the fan is mounted on the server chassis via a fan frame. Since the vibration generated due to the operation of the fan generally is transferred to one or more disk drives of the server via the server chassis and adversely affects the operation of the disk drives, the fan frame is disposed on the server chassis via an elastic spacer, such as a pad or a sponge.

However, different servers include fans of different specifications and the vibrations generated by the fans of different specifications are transferred to the disk drives in different manners. Thus, an exclusive spacer should be designed for each server to effectively suppress the vibration generated by the fan from being transferred to the disk drives. In other words, the conventional spacer is not allowed to be used to suppress the vibrations generated by fans of different specifications in common and thus the manufacture cost of the server is increased. In addition, the conventional spacer not only adversely affects the circuit design of the motherboard of the server, but also adversely affects the flow of the air blown by the fan.

SUMMARY OF THE INVENTION

The invention provides a server chassis whose fan frame is disposed on the chassis body via a damper accommodating magnetorheological fluid, such that the damper is allowed to effectively suppress the vibrations generated by the fans of various specifications from being diffused on the server chassis.

One embodiment of this invention provides a server chassis including a chassis body, at least one damper and a fan frame. The at least one damper is fixed to the chassis body. The fan frame is disposed on the chassis body via the at least one damper. The at least one damper is a magnetorheological fluid damper.

According to the server chassis discussed by above embodiments, the fan frame is disposed on the chassis body via the magnetorheological fluid damper. Thus, when the specification of the fan disposed in the fan frame that is mounted on the chassis body via the damper changes, the magnetic field generated by a magnetorheological fluid in the damper is changed based on the amplitude of the vibration generated by the fan disposed in the fan frame, thereby changing the apparent viscosity of the magnetorheological fluid in the damper. Accordingly, the damper is allowed to absorb the vibration with larger magnitude by the magnetorheological fluid of higher apparent viscosity and to absorb the vibration with smaller magnitude by the magnetorheological fluid of lower apparent viscosity. Thus, the damper effectively suppresses the vibrations generated by the fans of various specifications from being diffused on the server chassis via the fan frame.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
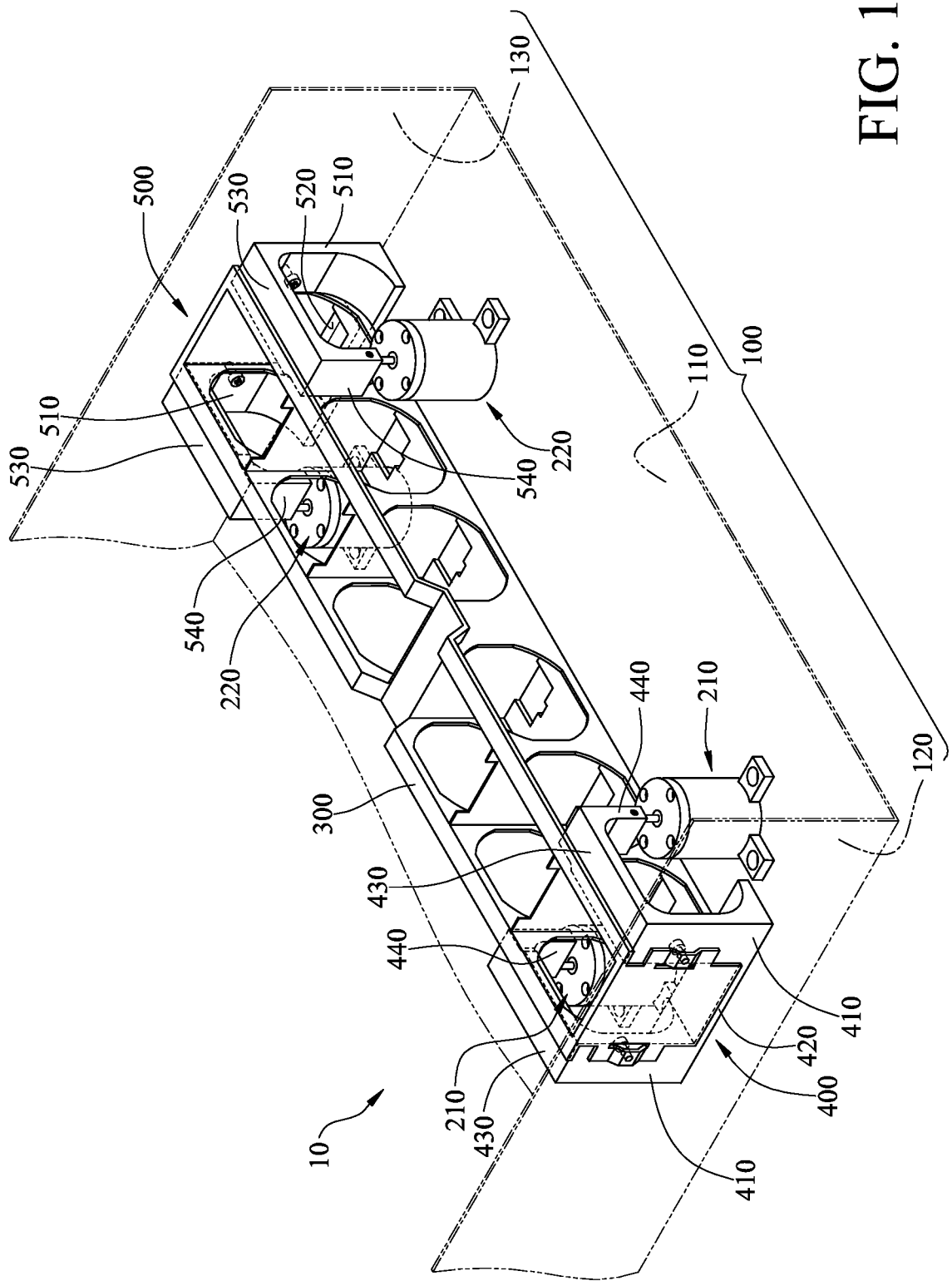
FIG. 1 is a perspective view of a server chassis according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
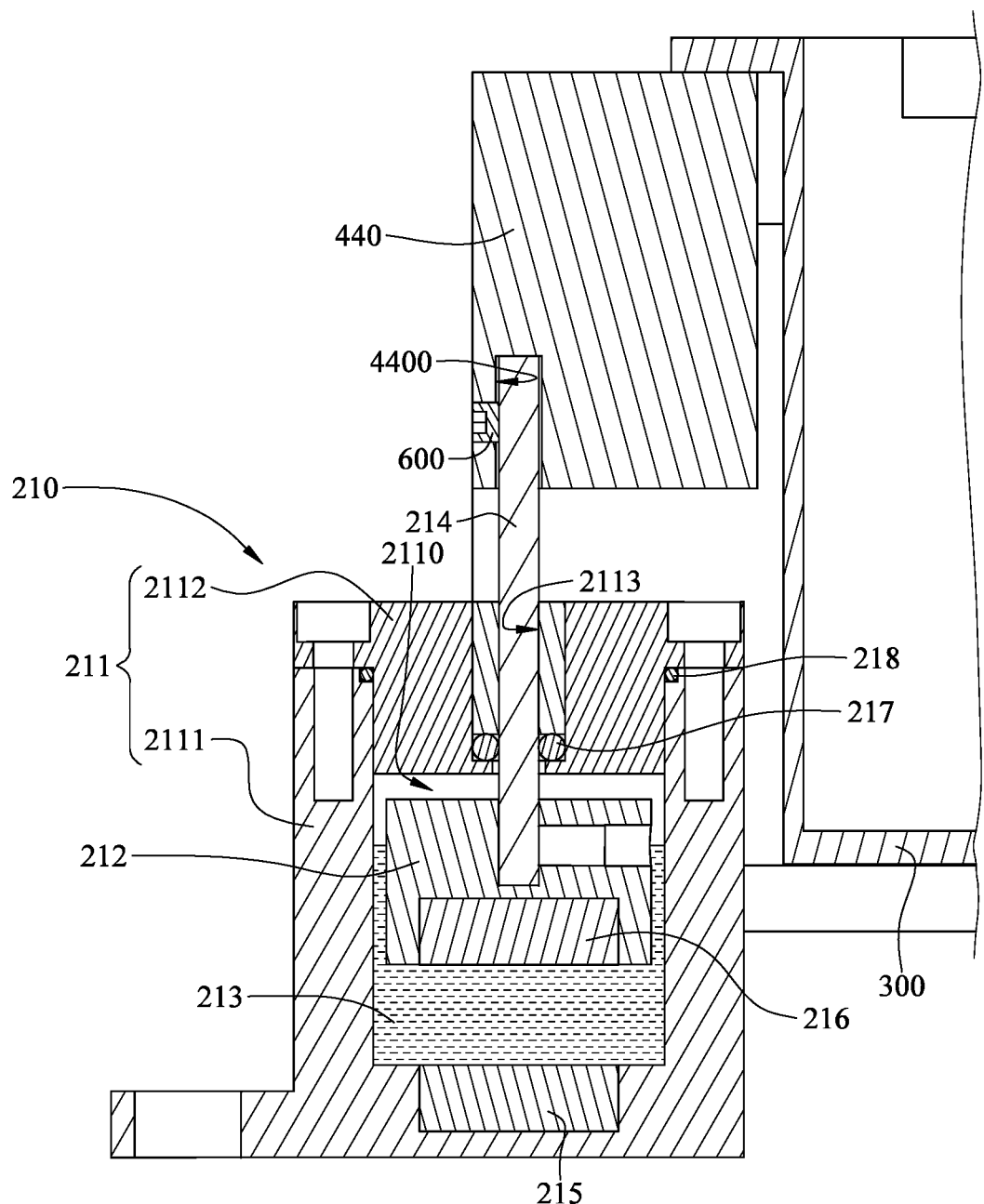
FIG. 2 is a partially enlarged cross-sectional view of the server chassis in FIG. 1.

Please refer to FIGS. 1 and 2. FIG. 1 is a perspective view of a server chassis 10 according to one embodiment of the invention. FIG. 2 is a partially enlarged cross-sectional view of the server chassis 10 in FIG. 1.

In this embodiment, the server chassis 10 includes a chassis body 100, two first dampers 210, two second dampers 220 and a fan frame 300.

In this embodiment, the chassis body 100 includes a bottom plate 110, a first side plate 120 and a second side plate 130. The first side plate 120 and the second side plate 130 stand on two opposite sides of the bottom plate 110, respectively.

The two first dampers 210 and the two second dampers 220 are located between the first side plate 120 and the second side plate 130, and are fixed to the bottom plate 110. The two first dampers 210 and the two second dampers 220 are magnetorheological fluid dampers (i.e., dampers accommodating magnetorheological fluid).

The fan frame 300 is located between the first side plate 120 and the second side plate 130. The fan frame 300 is disposed on the bottom plate 110 via the two first dampers 210 and the two second dampers 220.

In this embodiment, the server chassis 10 further includes a first mounting bracket 400 and a second mounting bracket 500. The first dampers 210 and the second dampers 220 are disposed on the fan frame 300 via the first mounting bracket 400 and the second mounting bracket 500 so as to be spaced apart from the fan frame 300. At least a part of each of the first dampers 210 and at least a part of each of the second dampers 220 are located between a side of the fan frame 300 that is located closest to the bottom plate 110 and a side of the fan frame 300 that is located farthest away from the bottom plate 110.

The first mounting bracket 400 includes two first fixed parts 410, a first connection part 420 and two first protruding parts 430. The two first fixed parts 410 are fixed to two opposite sides of the first connection part 420, respectively. The two first fixed parts 410 are fixed to a side of the fan frame 300 that is located closest to the first side plate 120 via, for example, screwing. The two first protruding parts 430 protrude from the two first fixed parts 410 toward the second side plate 130, respectively. The fan frame 300 is located between the two first protruding parts 430. In this embodiment, the first mounting bracket 400 further includes two first extension parts 440. The two first extension parts 440 extend from sides of the two first protruding parts 430 that are located farthest away from the first side plate 120 toward the bottom plate 110, respectively. The two first dampers 210 are fixed to sides of the two first extension parts 440 that are located closest to the bottom plate 110, respectively.

The second mounting bracket 500 includes two second fixed parts 510, a second connection part 520 and two second protruding parts 530. The two second fixed parts 510 are fixed to two opposite sides of the second connection part 520, respectively. The two second fixed parts 510 are fixed to a side of the fan frame 300 that is located closest to the second side plate 130 via, for example, screwing. The two second protruding parts 530 protrude from the two second fixed parts 510 toward the first side plate 120, respectively. The fan frame 300 is located between the two second protruding parts 530. The two second dampers 220 are fixed to sides of the two second protruding parts 530 that are located farthest away from the second side plate 130. In this embodiment, the second mounting bracket 500 further includes two second extension parts 540. The two second extension parts 540 extend from sides of the two second protruding parts 530 that are located farthest away from the second side plate 130 toward the bottom plate 110, respectively. The two second dampers 220 are fixed to sides of the two second extension parts 540 that are located closest to the bottom plate 110, respectively.

Since the two first dampers 210 and the two second dampers 220 are similar in structure, only the detail structure of one first damper 210 will be described below. In this embodiment, the first damper 210 includes a housing 211, a piston plug 212, a magnetorheological fluid 213, a guide rod 214, a first magnetic component 215 and a second magnetic component 216. The housing 211 is fixed on the bottom plate 110 and includes a space 2110. The piston plug 212 is movably disposed in the space 2110. The magnetorheological fluid 213 is accommodated in the space 2110, and a part of the space 2110 is not filled with the magnetorheological fluid 213. In this embodiment, the magnetorheological fluid 213 is produced by, for example, mixing 25% of magnetorheological fluid (MRF) and 75% of silicon oil, mixing 50% of magnetorheological fluid (MRF) and 50% of silicon oil, mixing 75% of magnetorheological fluid (MRF) and 25% of silicon oil, or 100% of magnetorheological fluid (MRF). Two opposite ends of the guide rod 214 are fixed to the piston plug 212 and the first mounting bracket 400, respectively. Specifically, in this embodiment, the server chassis 10 further includes a screw 600. Each of the first extension parts 440 of the first mounting bracket 400 includes a recess 4400. An end of the guide rod 214 of the first damper 210 is inserted into the recess 4400 and is fixed to the first protruding part 430 of the first mounting bracket 400 via the screw 600. The first magnetic component 215 is fixed to the housing 211. The second magnetic component 216 is fixed to the piston plug 212. In this embodiment, the housing 211 includes a base 2111 and a cover 2112. The base 2111 is fixed to the bottom plate 110 via, for example, screwing. The space 2110 is located in the base 2111. The cover 2112 is fixed to a side of the base 2111 that is located farthest away from the bottom plate 110 via, for example, screwing. The guide rod 214 is disposed in a through hole 2113 of the cover 2112. In this embodiment, the first damper 210 further includes a first sealing ring 217 and a second sealing ring 218. The first sealing ring 217 is clamped between the cover 2112 and the guide rod 214, and the second sealing ring 218 is clamped between the base 2111 and the cover 2112. Thus, the seal effect of the first damper 210 is enhanced to prevent the magnetorheological fluid 213 from being leaked from the housing 211.

Since the fan frame 300 is disposed on the bottom plate 110 with the help of the first dampers 210, the second dampers 220, the first mounting bracket 400 and the second mounting bracket 500, the first dampers 210 and the second dampers 220 can suppress 78% or more of the vibration generated by the fan disposed on the fan frame 300 from diffusing on the chassis body 100 in triaxial direction.

Additionally, in this embodiment, the fan frame 300 is spaced apart from the first side plate 120 and the second side plate 130, and the fan frame 300 is spaced apart from the bottom plate 110. Thus, the vibration is prevented from being transferred from the fan frame 300 to the first side plate 120, the second side plate 130 or the bottom plate 110. However, the invention is not limited thereto. In other embodiments, the fan frame may be in contact with the first side plate or the second side plate. Alternatively, in other embodiments, the fan frame may be in contact with the bottom plate.

Note that in other embodiments, the guide rod of the first damper and the first protruding parts of the first mounting bracket may be riveted to each other. In other embodiments, the first mounting bracket may be fixed to the side of the fan frame that is located closest to the bottom plate. In other embodiments, the fan frame may be disposed on the first side plate or the second side plate via at least one damper located between the fan frame and the bottom plate. In other embodiments, the server chassis may merely include the first or the second mounting bracket. Alternatively, in still other embodiments, the server chassis may not include the first and the second mounting brackets, and the fan frame may be directly disposed on the damper. In other embodiments, the server chassis may include one first damper and may not include the second damper. In other embodiments, the first mounting bracket may not include the first extension parts, and the first dampers may be fixed to sides of the two first protruding parts located farthest away from the first side plate, respectively.

According to the server chassis discussed by above embodiments, the fan frame is disposed on the chassis body via the magnetorheological fluid damper. Thus, when the specification of the fan disposed in the fan frame that is mounted on the chassis body via the damper changes, the magnetic field generated by a magnetorheological fluid in the damper is changed based on the amplitude of the vibration generated by the fan disposed in the fan frame, thereby changing the apparent viscosity of the magnetorheological fluid in the damper. Accordingly, the damper is allowed to absorb the vibration with larger magnitude by the magnetorheological fluid of higher apparent viscosity and to absorb the vibration with smaller magnitude by the magnetorheological fluid of lower apparent viscosity. Thus, the damper effectively suppresses the vibrations generated by the fans of various specifications from being diffused on the server chassis via the fan frame. In addition, the damper according to the invention suppresses 78% or more of the vibration generated by the fan disposed on the fan frame from diffusing on the chassis body in triaxial direction.

In an embodiment of the invention, the server chassis according to the invention may effectively suppress the vibration generated by the fan and thus prevent the reading performance of a disk drive from being reduced. Thus, the server equipped with the server chassis according to the invention is suitable for Artificial Intelligence (AI) computing, Edge Computing, and may be implemented as 5G server, cloud server or Vehicle-to-everything (V2X) server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server chassis, comprising:
a chassis body;
at least one damper, fixed to the chassis body; and
a fan frame, disposed on the chassis body via the at least one damper;
wherein the at least one damper is a magnetorheological fluid damper;
wherein the chassis body comprises a bottom plate, a first side plate and a second side plate, the first side plate and the second side plate stand on two opposite sides of the bottom plate, respectively, the fan frame and the at least one damper are located between the first side plate and the second side plate, and the fan frame is disposed on the bottom plate via the at least one damper; and
wherein the server chassis further comprises at least one mounting bracket, the at least one damper is disposed on the fan frame via the at least one mounting bracket so as to be spaced apart from the fan frame, and at least a part of the at least one damper is located between a side of the fan frame that is located closest to the bottom plate and a side of the fan frame that is located farthest away from the bottom plate.

2. The server chassis according to claim 1, wherein the fan frame is spaced apart from the first side plate and the second side plate.

3. The server chassis according to claim 1, wherein the fan frame is disposed on the bottom plate via the at least one damper so as to be spaced apart from the bottom plate.

4. The server chassis according to claim 1, wherein the at least one damper comprises a housing, a piston plug, a magnetorheological fluid, a guide rod, a first magnetic component and a second magnetic component, the housing is fixed to the bottom plate and comprises a space, the piston plug is movably disposed in the space, the magnetorheological fluid is accommodated in the space, two opposite ends of the guide rod are fixed to the piston plug and the at least one mounting bracket, respectively, the first magnetic component is fixed to the housing, and the second magnetic component is fixed to the piston plug.

5. The server chassis according to claim 4, further comprising a screw, wherein the at least one mounting bracket comprises a recess, an end of the guide rod of the at least one damper is inserted into the recess and is fixed to the at least one mounting bracket via the screw.

6. The server chassis according to claim 1, wherein the at least one mounting bracket is fixed to a side of the fan frame that is located closest to the first side plate.

7. The server chassis according to claim 6, wherein the at least one mounting bracket comprises a fixed part and a protruding part, the fixed part is fixed to the side of the fan frame that is located closest to the first side plate, the protruding part protrudes from the fixed part toward the second side plate, and the at least one damper is fixed to a side of the protruding part that is located farthest away from the first side plate.

8. The server chassis according to claim 7, wherein the at least one damper comprises two first dampers and two second dampers, the at least one mounting bracket comprises a first mounting bracket and a second mounting bracket, the first mounting racket comprises two first fixed parts, a first connection part and two first protruding parts, the two first fixed parts are fixed to two opposite sides of the first connection part, respectively, the two first fixed parts are fixed to the side of the fan frame that is located closest to the first side plate, the two first protruding parts protrude from the two first fixed parts toward the second side plate, respectively, the fan frame is located between the two first protruding parts, the two first dampers are fixed to sides of the two first protruding parts that are located farthest away from the first side plate, respectively, the second mounting bracket comprises two second fixed parts, a second connection part and two second protruding parts, the two second fixed parts are fixed to two opposite sides of the second connection part, respectively, the two second fixed parts are fixed to the side of the fan frame that is located closest to the second side plate, the two second protruding parts protrude from the two second fixed parts toward the first side plate, respectively, the fan frame is located between the two second protruding parts, and the two second dampers are fixed to sides of the two second protruding parts that are located farthest away from the second side plate, respectively.

\* \* \* \* \*